United States Patent
Baek et al.

(10) Patent No.: US 9,564,368 B2
(45) Date of Patent: Feb. 7, 2017

(54) SEMICONDUCTOR DEVICE AND METHOD OF FABRICATING THE SAME

(71) Applicants: Sanghoon Baek, Seoul (KR); Jae-Ho Park, Suwon-si (KR); Seolun Yang, Gwacheon-si (KR); Taejoong Song, Seongnam-si (KR); Sang-Kyu Oh, Gwacheon-si (KR)

(72) Inventors: Sanghoon Baek, Seoul (KR); Jae-Ho Park, Suwon-si (KR); Seolun Yang, Gwacheon-si (KR); Taejoong Song, Seongnam-si (KR); Sang-Kyu Oh, Gwacheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/077,351

(22) Filed: Mar. 22, 2016

(65) Prior Publication Data
US 2016/0204112 A1 Jul. 14, 2016

Related U.S. Application Data

(63) Continuation of application No. 14/814,601, filed on Jul. 31, 2015, now Pat. No. 9,324,619.
(Continued)

(30) Foreign Application Priority Data

Jan. 30, 2015 (KR) ........................ 10-2015-0014806

(51) Int. Cl.
*H01L 27/088* (2006.01)
*H01L 21/70* (2006.01)
(Continued)

(52) U.S. Cl.
CPC ... *H01L 21/823431* (2013.01); *H01L 21/0274* (2013.01); *H01L 21/308* (2013.01);
(Continued)

(58) Field of Classification Search
CPC .......... H01L 21/82; H01L 21/30; H01L 21/02; H01L 21/76; H01L 27/11; H01L 27/10; H01L 21/70; H01L 27/088
(Continued)

(56) References Cited

U.S. PATENT DOCUMENTS 7,257,790 B2 8/2007 Maeda
7,394,116 B2 7/2008 Kim et al.
(Continued)

FOREIGN PATENT DOCUMENTS

JP 4599048 B2 10/2010
JP 5322668 G2 7/2013
(Continued)

*Primary Examiner* — Yuanda Zhang
*Assistant Examiner* — Sheikh Maruf
(74) *Attorney, Agent, or Firm* — Volentine & Whitt, PLLC

(57) ABSTRACT

A method of fabricating a semiconductor device having a first region, a second region, and a third region between the first and second regions includes forming first and second preliminary active patterns protruding from a substrate in the first and second regions, respectively, forming mask patterns exposing the third region on the substrate, performing a first etching process using the mask patterns an etch mask to form first and second active patterns, respectively, and forming gate structures on the substrate.

14 Claims, 19 Drawing Sheets

Related U.S. Application Data

(60) Provisional application No. 62/041,473, filed on Aug. 25, 2014.

(51) Int. Cl.

| | | |
|---|---|---|
| *H01L 21/8234* | (2006.01) | |
| *H01L 21/308* | (2006.01) | |
| *H01L 21/027* | (2006.01) | |
| *H01L 21/762* | (2006.01) | |
| *H01L 27/11* | (2006.01) | |
| *H01L 27/108* | (2006.01) | |
| *H01L 27/02* | (2006.01) | |
| *H01L 29/78* | (2006.01) | |

(52) U.S. Cl.
CPC .... *H01L 21/3086* (2013.01); *H01L 21/76224* (2013.01); *H01L 21/823437* (2013.01); *H01L 21/823475* (2013.01); *H01L 21/823481* (2013.01); *H01L 27/0207* (2013.01); *H01L 27/10879* (2013.01); *H01L 27/10894* (2013.01); *H01L 27/11* (2013.01); *H01L 29/7851* (2013.01); H01L 27/1104 (2013.01); H01L 27/1116 (2013.01)

(58) Field of Classification Search
USPC ........................ 257/324, 192, 365, 329, 401, 314,257/E21.442, E21.42, E21.623, E21.421,257/E21.415; 438/283, 238, 275, 258, 197, 288
See application file for complete search history.

(56) References Cited

U.S. PATENT DOCUMENTS

| | | |
|---|---|---|
| 8,329,592 B2 | 12/2012 | Inagba |
| 8,455,945 B2 | 6/2013 | Lee et al. |
| 8,623,712 B2 | 1/2014 | Cheng et al. |
| 8,822,320 B2 | 9/2014 | Cheng et al. |
| 2005/0151275 A1* | 7/2005 | Kim ........................ H01L 27/11 257/427 |
| 2007/0049035 A1* | 3/2007 | Tran .................... H01L 21/0337 438/696 |
| 2007/0049040 A1* | 3/2007 | Bai ..................... H01L 21/0337 438/712 |
| 2007/0235785 A1* | 10/2007 | Kahng ............. H01L 29/42384 257/297 |
| 2008/0029825 A1* | 2/2008 | Saito ................. H01L 21/28518 257/371 |
| 2008/0070165 A1* | 3/2008 | Fischer ............... H01L 21/0338 430/314 |
| 2008/0124871 A1* | 5/2008 | Seo ................... H01L 29/66795 438/270 |
| 2010/0285643 A1* | 11/2010 | Lee ....................... G11C 11/412 438/232 |
| 2012/0100706 A1* | 4/2012 | Sim ................... H01L 27/11531 438/591 |
| 2014/0001562 A1 | 1/2014 | Liaw |
| 2014/0353765 A1* | 12/2014 | Woo .................. H01L 21/3086 257/391 |
| 2015/0137252 A1 | 5/2015 | Baek et al. |

FOREIGN PATENT DOCUMENTS

| | | |
|---|---|---|
| KR | 10-0594282 G1 | 6/2006 |
| KR | 10-2010-0110098 A1 | 10/2010 |
| KR | 10-1040367 B1 | 6/2011 |

\* cited by examiner

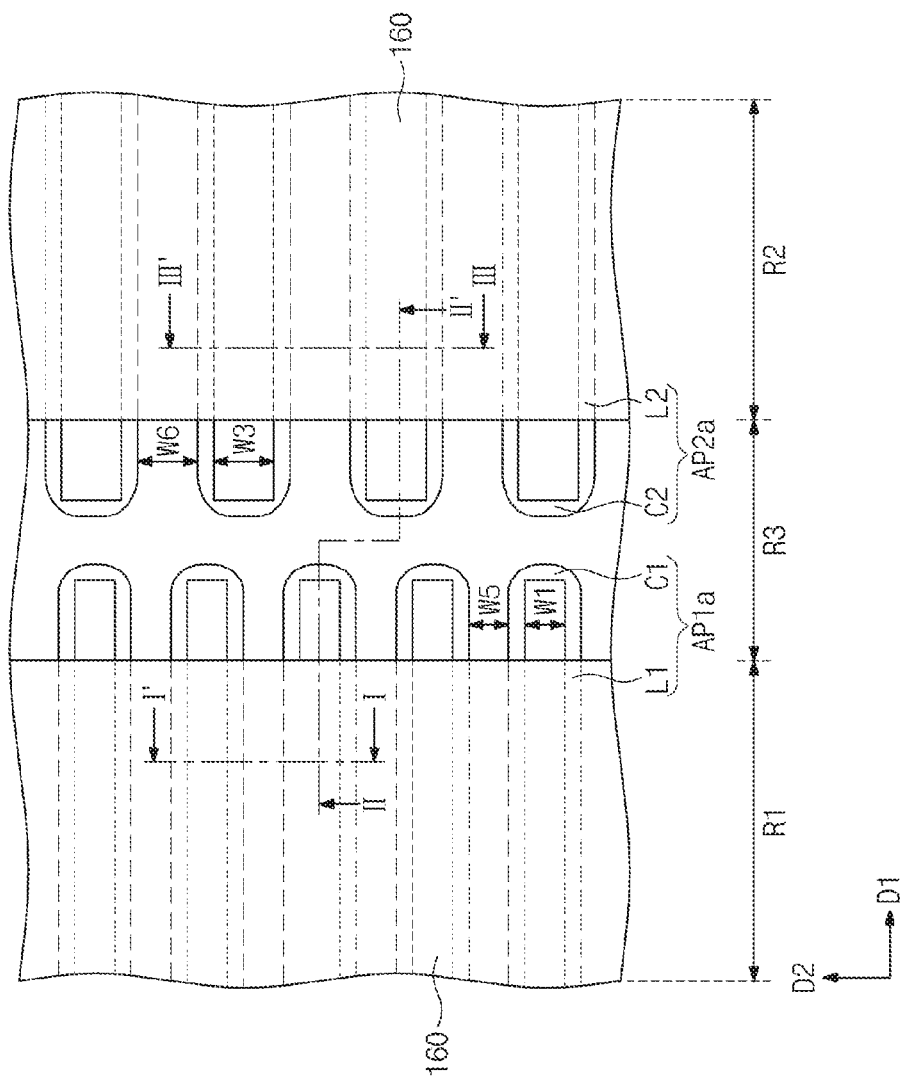

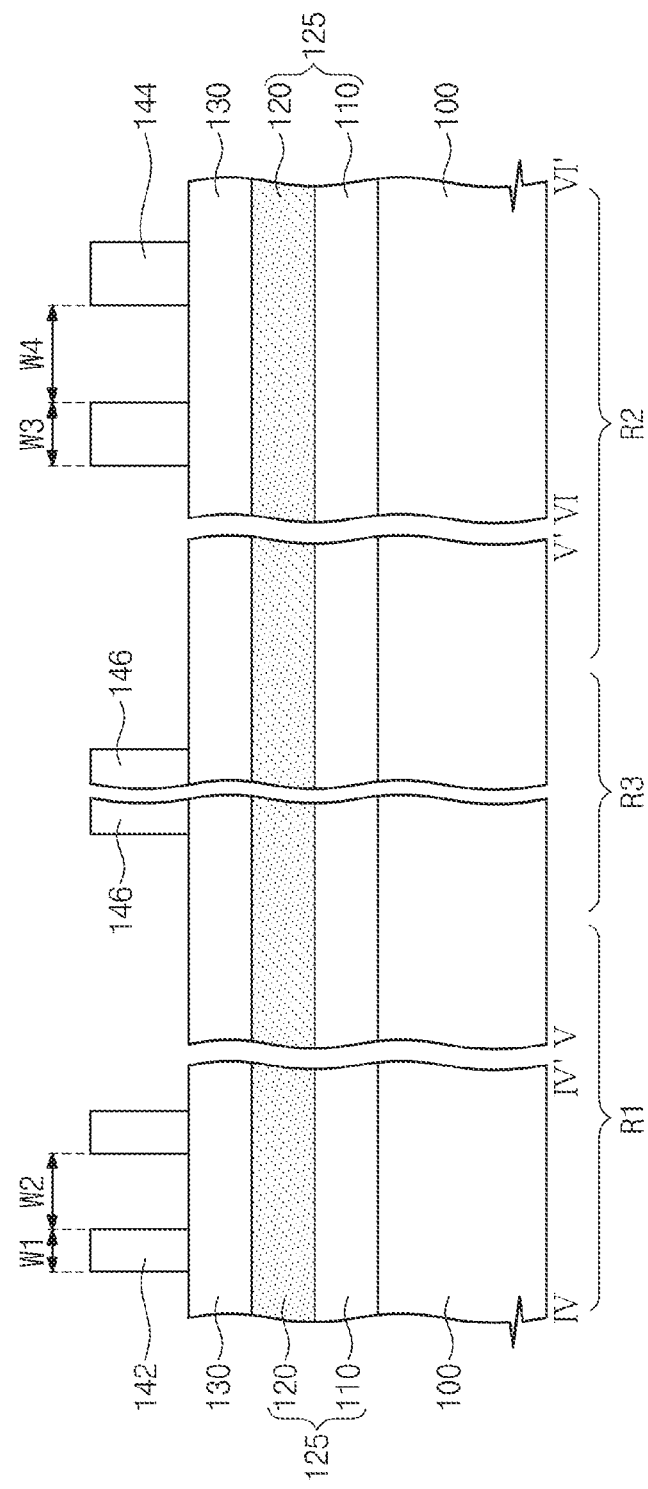

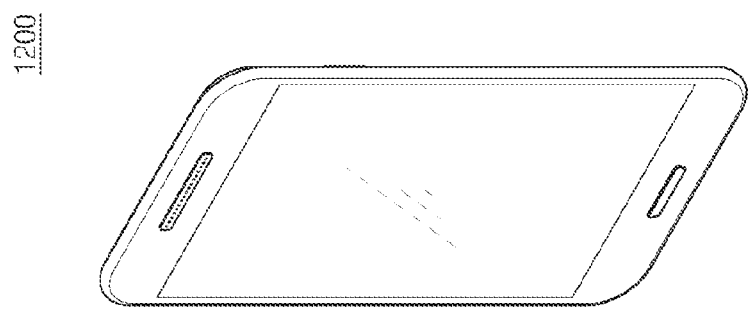
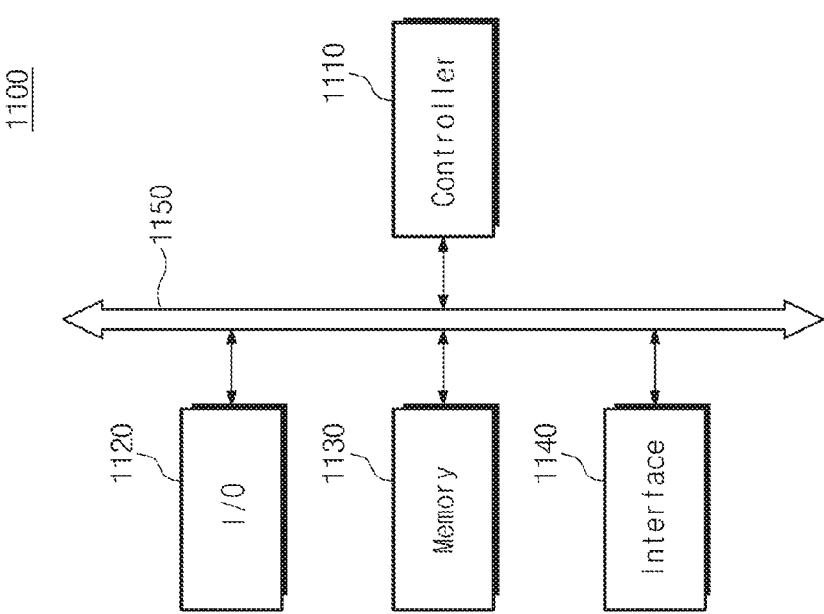

SEMICONDUCTOR DEVICE AND METHOD OF FABRICATING THE SAME

PRIORITY STATEMENT

This is a Continuation of U.S. application Ser. No. 14/814,601, filed Jul. 31, 2015, which U.S. non-provisional patent application claims priority under 35 U.S.C. §119 to U.S. Provisional Patent Application No. 62/041,473, filed on Aug. 25, 2014 and Korean Patent Application No. 10-2015-0014806, filed on Jan. 30, 2015, the entire contents of which are hereby incorporated by reference.

BACKGROUND

Representative embodiments of the inventive concept are drawn to semiconductor devices and to methods of fabricating the same. In particular, to a fin field effect transistor and a method of fabricating the same.

In order to realize a highly-integrated semiconductor device, it is necessary form fine patterns. For example, each pattern should be formed to have an area or footprint that is as small as possible so that more and more devices may be provided per given area. In particular, patterns should be formed in such a way to minimize the pitch of the patterns or the sum of the widths of and space between adjacent ones of the patterns. However, such patterns are typically formed using photolithography. As the design rules of semiconductor devices have become drastically smaller, photolithography is being stretched to the limit in terms of the resolution that can be achieved. Thus, as the pitch of patterns of a semiconductor device become finer to comply with the smaller design rules, it becomes more and more difficult to form the patterns.

SUMMARY

According the inventive concept, there are provided representative embodiments of a method of fabricating a semiconductor device including providing a substrate spanning first, second, and third regions of the device, forming first preliminary active patterns and second preliminary active patterns on the substrate such that the first and second preliminary active patterns protrude from the substrate, the first preliminary active patterns extend from the first region into the third region so as to overlap the substrate in the third region, and the second preliminary active patterns extend from the second region into the third region so as to also overlap the substrate in the third region, forming mask patterns on the substrate in the first and second regions but not in the third region thereby leaving the substrate exposed in the third region, performing a first etching process comprising etching the first and second preliminary active patterns using the mask patterns as an etch mask to form first and second active patterns from the first and second preliminary active patterns, respectively, and forming a first gate structure crossing the first active patterns and a second gate structure crossing the second active patterns. The first active patterns are formed to extend longitudinally in a first direction and so as to be spaced apart from each other in a second direction crossing the first direction. The second active patterns are formed to extend in the first direction and so as to be spaced apart from each other in the second direction. The first direction is one that extends across the first, second and third regions. Furthermore, distances, in the second direction, between adjacent ones of the first active patterns are different from those between adjacent ones of the second active patterns.

According to the inventive concept, there are also provided representative embodiments of a method of fabricating a semiconductor device including patterning a substrate to form a first trench defining first preliminary active patterns which extend longitudinally in a first direction and are spaced apart from each other in a second direction crossing the first direction, and second preliminary active patterns which extend longitudinally in the first direction and are spaced apart from the first preliminary active patterns in the first direction and from each other in the second direction, forming mask patterns on the substrate which expose end portions of the first and second preliminary active patterns, performing an etching process, in which the mask patterns are used as an etch mask, that removes the end portions of the first and second preliminary active patterns and forms first and second active patterns therefrom, respectively, and forming a first gate structure crossing the first active patterns and a second gate structure crossing the second active patterns, on the substrate. Also, the active patterns are formed such that a distance in the second direction between adjacent ones of the first preliminary active patterns being different than a distance in the second direction between adjacent ones of the second preliminary active patterns. Furthermore, the end portions of the first preliminary active patterns are collectively spaced in the first from the end portions of the second preliminary active patterns direction. Moreover, the etching process forms a second trench having a bottom disposed at a level lower than a bottom of the first trench, and such that a width of the second trench in the first direction is equal to a distance between a collection of all of the first active patterns and a collection of all of the second active patterns in the first direction.

According to the inventive concept, there are also provided representative embodiments of a method of fabricating a semiconductor device including forming a sacrificial layer on a substrate, performing a photolithography process to form on the sacrificial layer a patterned layer of photoresist comprising first photoresist patterns and second photoresist patterns with at least one of the first photoresist patterns extending from a memory cell region into a third region and at least one of the second photoresist patterns extending from a peripheral circuit region into the third region, etching the sacrificial layer using the patterned layer of photoresist as an etch mask to form a patterned layer of sacrificial material in the memory cell region, the peripheral circuit region and the third region, forming a sidewall surface spacer along side surfaces of the patterned layer of sacrificial material, removing the patterned layer of sacrificial material and etching the substrate using the spacer as an etch mask to pattern the substrate in the memory cell region, the peripheral circuit region and the third region, forming a mask on the substrate that covers the portions of the substrate patterned in both the memory cell and peripheral circuit regions while exposing the portion of the substrate patterned in the third region, etching the substrate in the third region, using the mask as an etch mask, to remove the portion of the substrate patterned in the third region and thereby form a plurality of first active regions of the substrate in the memory cell region and a plurality of second active regions of the substrate in the peripheral circuit region, forming a first gate that extends across the first active regions, and forming a second gate that extends across the second active regions.

According to the inventive concept, there are also provided representative embodiments of a semiconductor device including a substrate extending in a first region, a second region, and a third region between the first and second regions, first active patterns protruding upward from the first region of the substrate, extending in a first direction crossing the first to third regions, and being spaced apart from each other in a second direction crossing the first direction, second active patterns protruding upward from the second region of the substrate, extending in the first direction, and being spaced apart from each other in the second direction, distances in the second direction between adjacent ones of the first active patterns being different from those between adjacent ones of the second active patterns, a first gate structure crossing the first active patterns, and a second gate structure crossing the second active patterns. The third region is defined by a trench in the substrate between the first and second regions. Sidewall surfaces of the first active patterns are aligned along the second direction at a boundary between the first and third regions, and sidewall surfaces of the second active patterns are aligned along the second direction at a boundary between the second and third regions.

BRIEF DESCRIPTION OF THE DRAWINGS

The inventive concept, and objects, feature and advantages thereof, will be more clearly understood from the following detailed description taken in conjunction with the accompanying drawings. The accompanying drawings illustrate non-limiting, i.e., representative, embodiments.

FIGS. 1A, 2A, 3A, 4A, 5A, 6A, 7A and 8A illustrate a method of fabricating a semiconductor device according to representative embodiments of the inventive concept, and are each a plan view of the device during the course of its manufacture.

FIG. 9B is a composite of sectional view taken along lines IV-IV', V-V' and VI-VI' of FIG. 9A.

FIG. 10 is a schematic block diagram of an example of electronic systems including a semiconductor device fabricated according to the inventive concept.

FIG. 11 is a perspective view of a mobile phone to which the electronic system can be applied.

Figure 1A:
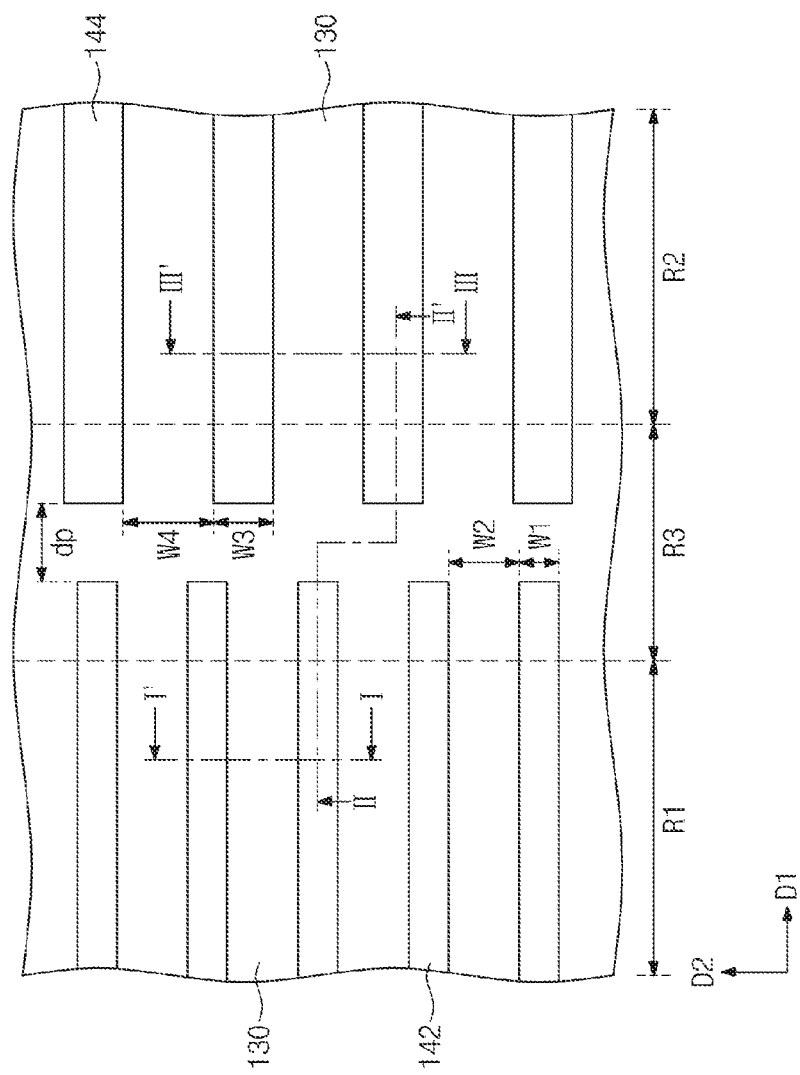

It should be noted that these figures are intended to illustrate the general characteristics of methods, structure and/or materials utilized in certain representative embodiments and to supplement the written description provided below. These drawings are not, however, to scale and may not precisely reflect the precise structural or performance characteristics of any given embodiment, and should not be interpreted as defining or limiting the range of values or properties encompassed by representative embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Representative embodiments of the inventive concepts will now be described more fully with reference to the accompanying drawings, in which representative embodiments are shown. Representative embodiments of the inventive concepts may, however, be embodied in many different forms and should not be construed as being limited to the embodiments set forth herein; rather, these embodiments are provided so that this disclosure will be thorough and complete, and will fully convey the concept of representative embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," on versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of representative embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of representative embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Representative embodiments of the inventive concepts are described herein with reference to cross-sectional illustrations that are schematic illustrations of idealized embodiments (and intermediate structures) of representative embodiments. As such, variations from the shapes of the illustrations as a result, for example, of manufacturing techniques and/or tolerances, are to be expected. Thus, representative embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of representative embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which representative embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. For instance, the term "pattern" may refer to a single feature or element or may refer to an entire series of features or elements formed by a patterning process as the context will make clear. Also, the term "size" will be generally understood as referring to the surface area or footprint of a particular feature or element.

A representative embodiment of a method of fabricating a semiconductor device, according to of the inventive concept, will now be described in detail with reference to FIGS. 1A through 8B.

Figure 1B:
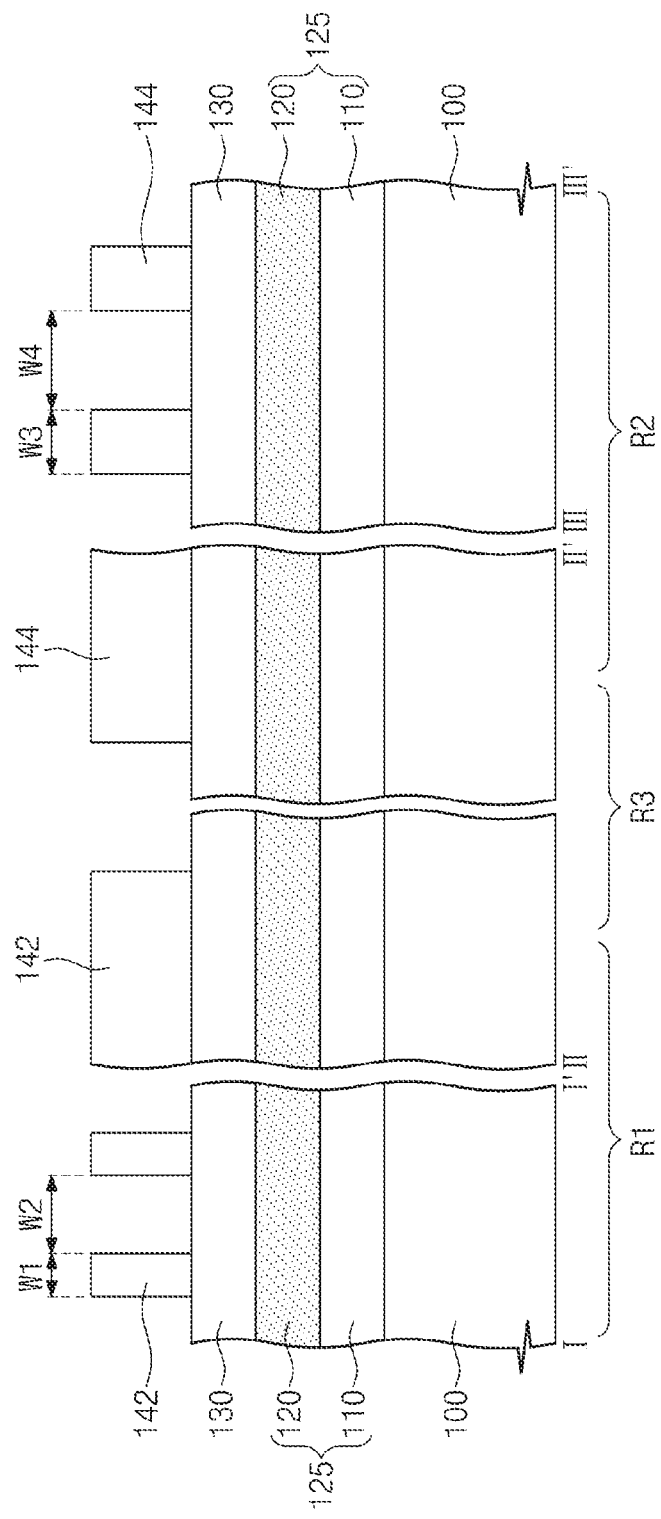
FIGS. 1B, 2B, 3B, 4B, 5B, 6B, 7B and 8B are each a composite of sectional views taken along lines I-I', II-II', and III-III' of FIGS. 1A through 8A, respectively.

Referring first to FIGS. 1A and 1B, a substrate 100 spanning first to third regions R1-R3 of the device may be provided. The first region R1 may be spaced apart from the second region R2, and the third region R3 may be interposed between the first region R1 and the second region R2. The substrate 100 may be formed of or include a semiconductor material. For example, the substrate 100 may be a semiconductor wafer or include an epitaxial layer. As an example, the substrate 100 may include a single-crystalline, polycrystalline, or amorphous layer of silicon, germanium, or silicon-germanium.

In exemplary embodiments, the first region R1 may be a cell array region, at which memory cell transistors for storing data are provided. For example, SRAM cells, each of which includes six or eight transistors, may be provided in the first region R1. But representative embodiments of the inventive concepts may not be limited thereto. The second region R2 may be a part of a peripheral circuit region, in which peripheral circuits are provided. For example, a column decoder or a sense amplifier may be provided in the second region R2. Peripheral circuit transistors electrically connected to the memory cell transistors of the first region R1 may be formed in the second region R2. The third region R3 may serve as a buffer region separating the transistors of the first and second regions R1 and R2 from each other, and due to the third region R3, it is possible to prevent the transistors of the first and second regions R1 and R2 from being disturbed or interfered with each other, when the transistors of the first and second regions R1 and R2 are operated.

A hard mask 125 and a sacrificial layer 130 may be sequentially formed on the substrate 100. In exemplary embodiments, the hard mask 125 may include a lower mask layer 110 on the substrate 100 and an upper mask layer 120 on the lower mask layer 110. The lower mask layer 110 may be formed of a material having an etch selectivity with respect to the substrate 100. As an example, the lower mask layer 110 may include at least one of silicon oxide, silicon nitride, and silicon oxynitride. The upper mask layer 120 may be formed of a material having an etch selectivity with respect to the lower mask layer 110. As an example, the upper mask layer 120 may be formed of or include polysilicon. The sacrificial layer 130 may be formed of a material having an etch selectivity with respect to the upper mask layer 120. As an example, the sacrificial layer 130 may be formed of or include a spin on hard mask (SOH) layer or an amorphous carbon layer (ACL). In the present embodiment, although the hard mask 125 is illustrated as a stack of two layers, representative embodiments of the inventive concepts may not be limited thereto. For example, in other representative embodiments, the hard mask 125 may include three layers. Although not shown, an etch stop layer may be formed on the sacrificial layer 130 so as to be interposed between the upper mask layer 120 and the sacrificial layer 130. The etch stop layer may be formed of or include, for example, a layer of SiON.

A photolithography process may be performed to form photoresist patterns on the sacrificial layer 130. In representative embodiments, the photoresist patterns may include first photoresist patterns 142 formed in the first region R1 and second photoresist patterns 144 formed in the second region R2. The forming of the first and second photoresist patterns 142 and 144 may include coating the sacrificial layer 130 with a resist material to form a photoresist layer and performing exposure and development processes on the photoresist layer. Although not shown, before the forming of the photoresist layer, an anti-reflecting layer (not shown) may be formed on the sacrificial layer 130. The anti-reflecting layer may comprise, for example, an organic anti-reflection coating (ARC). The first and second photoresist patterns 142 and 144 may be formed at substantially the same time.

In exemplary embodiments, the first and second photoresist patterns 142 and 144 may be repeatedly disposed on the substrate 100 to have a line-and-space arrangement. For example, each of the first photoresist patterns 142 may be a line pattern extending parallel to a first direction D1 and having a first width W1, when measured in a second direction D2. Here, the first and second directions D1 and D2 are not parallel (e.g., may be perpendicular) to each other. Furthermore, the first photoresist patterns 142 may be spaced apart from each other in the second direction D2 by a distance larger than the first width W1. Hereinafter, a second width W2 will represent the distance between the first photoresist patterns 142. Similarly, each of the second photoresist patterns 144 may be a line pattern extending parallel to the first direction D1 and having a third width W3, when measured in the second direction D2. The second photoresist patterns 144 may be spaced apart from each other in the second direction D2 by a distance larger than the third width W3. Hereinafter, a fourth width W4 will represent the distance between the second photoresist patterns 144. Here, the first width W1 may be different from the third width W3 (e.g., W1<W3), and the second width W2 may be different from the fourth width W4 (e.g., W2<W4). In other words, the first photoresist patterns 142 may be formed to have a pitch different from that of the second photoresist patterns 144. Although the first and second photoresist patterns 142 and 144 are illustrated as having a uniform pitch, representative embodiments of the inventive concepts may not be limited thereto.

According to representative embodiments of the inventive concept, the distance dp between the first and second photoresist patterns 142 and 144 may be smaller than a wavelength ($\lambda$) of light used in an exposure process for forming the first and second photoresist patterns 142 and 144 (i.e., dp<$\lambda$). In this case, due to difficult-to-control optical phenomena such as an optical proximity effect, the end portions of the first and second photoresist patterns 142 and 144 may not have the precise shapes shown in FIG. 1A, i.e., may be shaped differently from the main portions of the photoresist patterns 142 and 144.

In some cases of the representative embodiment, the first photoresist patterns 142 and the second photoresist patterns 144 are formed as spaced apart from each other in the first direction D1. For example, the first and second photoresist patterns 142 and 144 may have end portions in the third region R3, and an opposite pair of the end portions of the first and second photoresist patterns 142 and 144 may be spaced apart from each other in the first direction D1 by a distance dp. However, due to the above-mentioned optical phenomena, the end portions of the first photoresist patterns 142 may have a width greater or smaller than the first width W1, and the end portions of the second photoresist patterns 144 may have a width greater or smaller than the third width W3. Moreover, the distances between the first and second photoresist patterns 142 and 144 may not be uniform. In this case, the distance dp may be defined as the largest value of distances, in the first direction D1, between the end portions of the first and second photoresist patterns 142 and 144 adjacent to each other in the first direction D1.

Figure 9A:
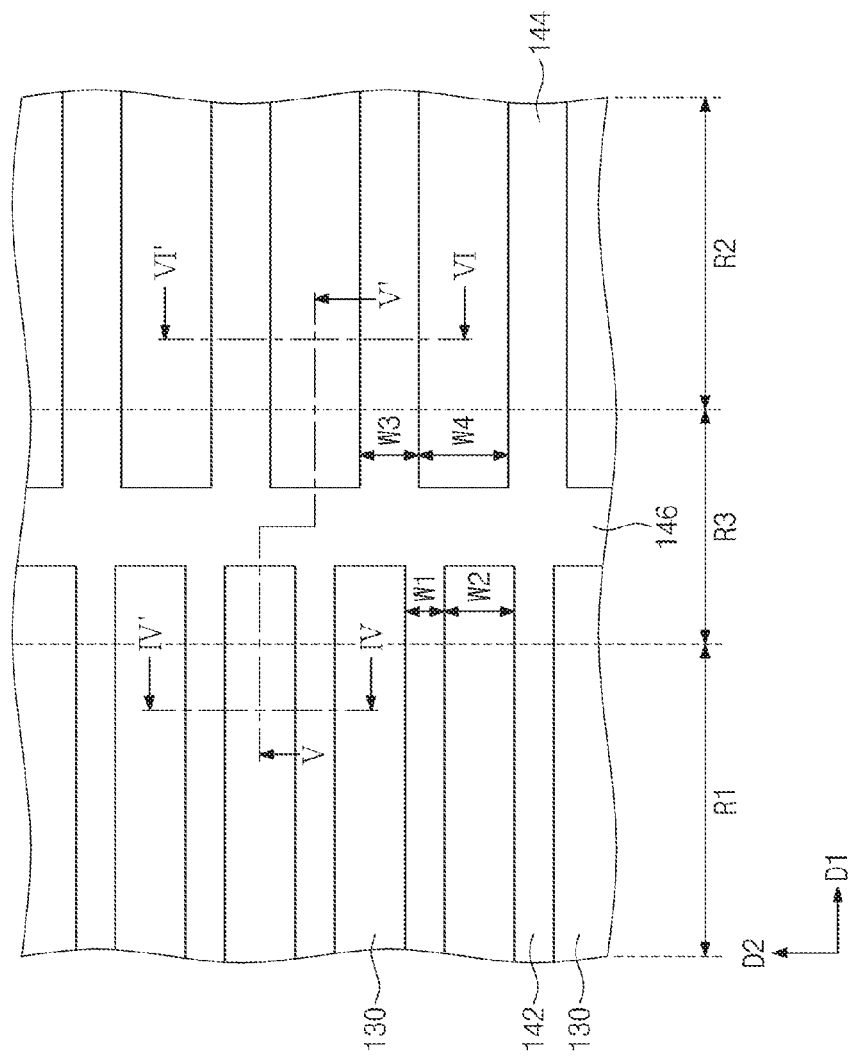
FIG. 9A is a plan view of first and second photoresist patterns that may be formed in a representative embodiment of a method of fabricating a semiconductor device according to the inventive concept.

In other cases of the representative embodiment, as shown in FIGS. 9A and 9B, the first and second photoresist patterns 142 and 144 are connected to each other. In particular, an optical proximity effect may occur when the first and second photoresist patterns 142 and 144 having different pitches are formed adjacent to each other. As a result, connection photoresist patterns 146 may be formed between end portions of the first and second photoresist patterns 142 and 144 to connect the first and second photoresist patterns 142 and 144 to each other. That is, the optical proximity effect may lead to an unintended connection between the end portions of the first and second photoresist patterns 142 and 144, and such an unintended connection pattern may constitute the connection photoresist patterns 146. Also, although the connection photoresist patterns 146 are illustrated as being contiguous to one another, i.e., to all of the first and second photoresist patterns 142 and 144 so as to constitute a single body therewith, the connection photoresist patterns 146 may take other forms. For example, each connection photoresist patterns 146 may connect only a respective one of the first photoresist patterns 142 and a respective one of the second photoresist patterns 144 to each other.

Shapes of sacrificial patterns, spacers, patterns of a hard mask, and preliminary active patterns, which will be formed in subsequent processes, may depend on the shapes of the photoresist patterns, but according to representative embodiments of the inventive concept, the shapes of the photoresist patterns may not lead to a difference in final shapes of active patterns. Furthermore, fabrication steps, which will be performed to form the active patterns, may be performed in the same manner, without dependence on the shapes of the photoresist patterns. Hereinafter, for the sake of simplicity, the description that follows will refer to an example of the present embodiment in which the first and second photoresist patterns have the shapes shown in FIGS. 1A and 1B.

Figure 2A:
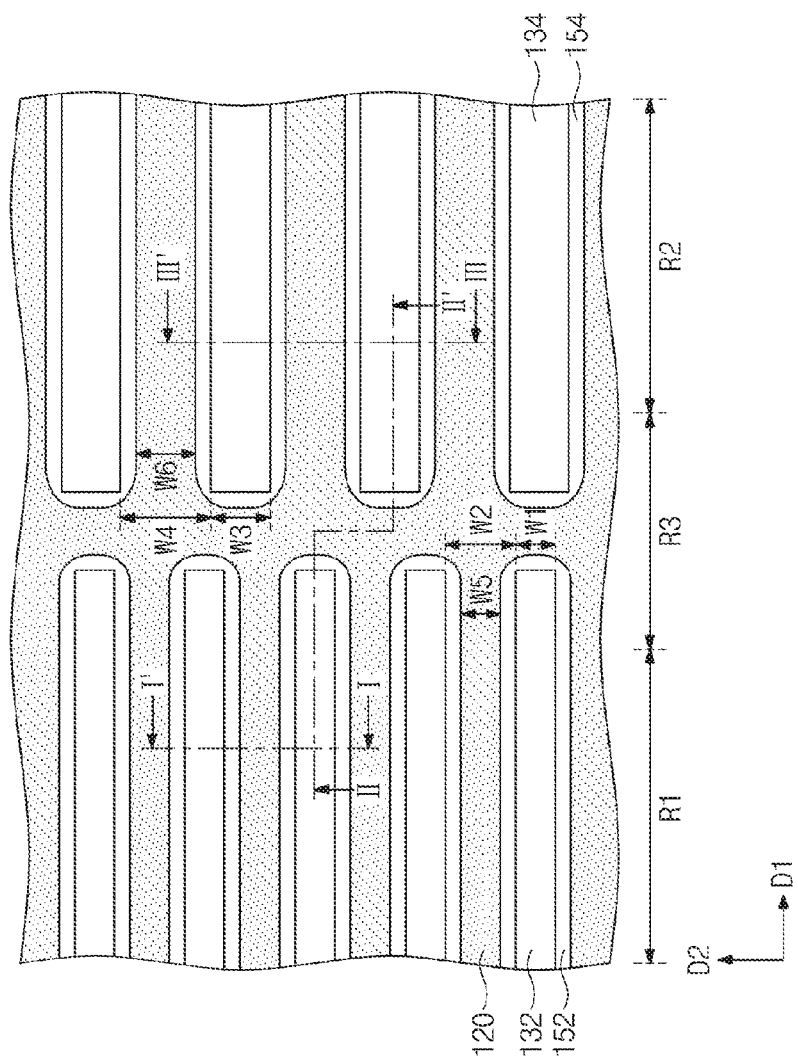
Figure 2B:
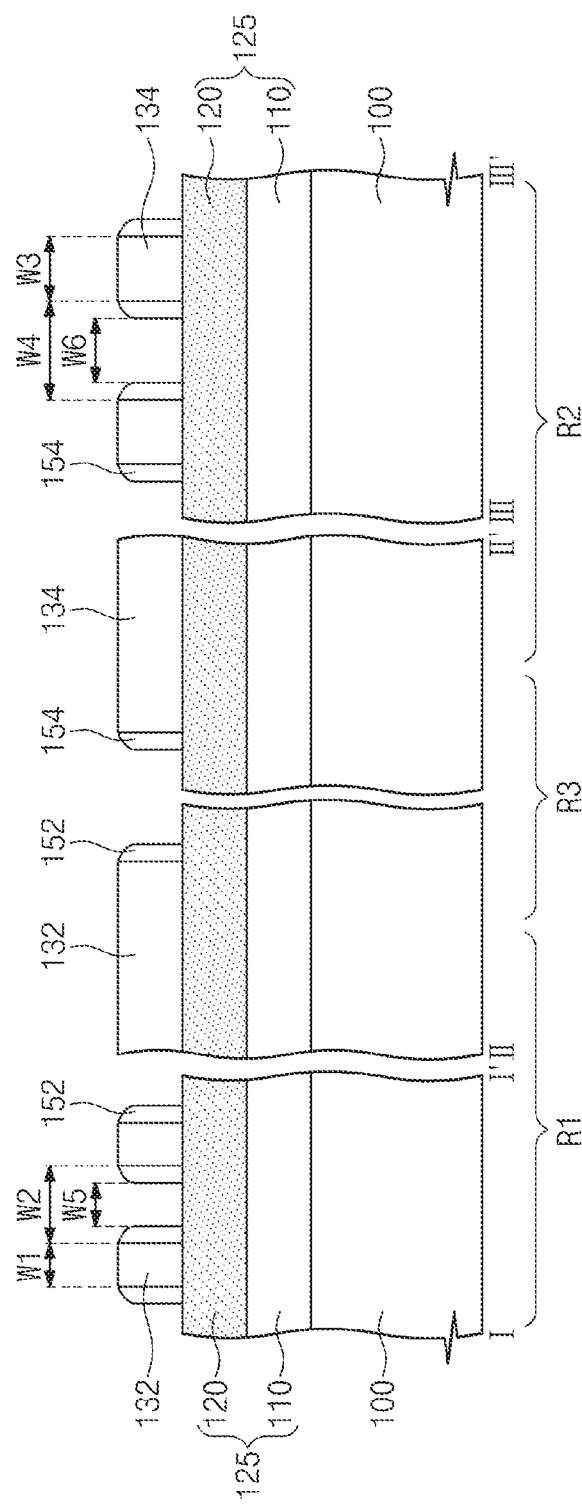

Referring to FIGS. 2A and 2B, the sacrificial layer 130 exposed by the first and second photoresist patterns 142 and 144 may be patterned to form first and second sacrificial patterns 132 and 134. The patterning of the sacrificial layer 130 may be performed using, for example, an anisotropic dry etching process, in which the first and second photoresist patterns 142 and 144 are used as an etch mask. Accordingly, when viewed in plan, the first sacrificial patterns 132 may be formed to have substantially the same shape as those of the first photoresist patterns 142 and the second sacrificial patterns 134 may be formed to have substantially the same shape as those of the second photoresist patterns 144. In other words, the first and second sacrificial patterns 132 and 134 may be repeatedly disposed on the substrate 100 to have a line-and-space arrangement, similar to that of the first and second photoresist patterns 142 and 144. The first sacrificial patterns 132 may be formed to have widths and a spacing or pitch substantially equal to those of the corresponding first photoresist patterns 142. Similarly, the second sacrificial patterns 134 may be formed to have widths and a spacing or pitch substantially equal to those of the corresponding second photoresist patterns 144. That is, the first sacrificial patterns 132 may be formed to have the first width W1, and an adjacent pair of the first sacrificial patterns 132 may be spaced apart from each other by the second width W2. The second sacrificial patterns 134 may be formed to have the third width W3, and an adjacent pair of the second sacrificial patterns 134 may be spaced apart from each other by the fourth width W4.

Subsequently, first spacers 152 may be formed to cover sidewall surfaces of the first sacrificial patterns 132 and second spacers 154 may be formed to cover sidewall surfaces of the second sacrificial patterns 134. In exemplary embodiments, the forming of the sidewall surface spacer, i.e., the first and second spacers 152 and 154, may include forming a spacer layer on the substrate 100 to conformally cover the first and second sacrificial patterns 132 and 134 and performing an anisotropic etching process (for example, without any other mask pattern) on the spacer layer to expose the upper mask layer 120. Accordingly, the first and second spacers 152 and 154 may be formed to encircle the first and second sacrificial patterns 132 and 134, respectively, in their entirety. The spacer layer may be formed of or include, for example, silicon oxide. The spacer layer may be formed by an atomic layer deposition (ALD) process. When measured in the second direction D2, the distance between adjacent ones of the first spacers 152 may be defined as a fifth width W5 and the distance between adjacent ones of the second spaces 154 may be defined as a sixth width W6. That is, the fifth width W5 may refer to the shortest distance between the sidewall surfaces of the first spacers 152 facing each other in the second direction D2, and the sixth width W6 may refer to the shortest distance between the sidewall surfaces of the second spacers 154 facing each other in the second direction D2. In examples of the representative embodiment, the fifth width W5 is substantially equal to the first width W1, and the sixth width W6 is substantially equal to the third width W3. The fifth width W5, therefore, may be dependent on the first width W1, the second width W2, and the thickness of the spacer layer. Similarly, the sixth width W6 may be dependent on the third width W3, the fourth width W4, and the thickness of the spacer layer.

Figure 3A:
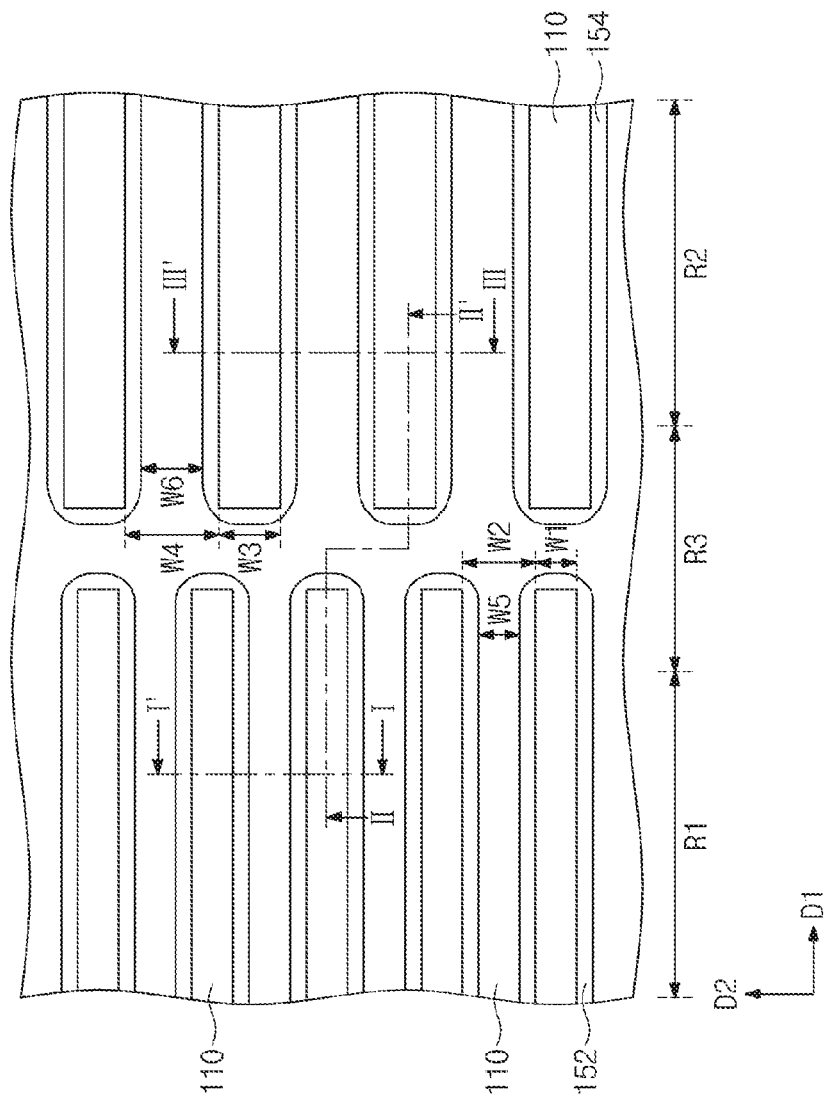
Figure 3B:
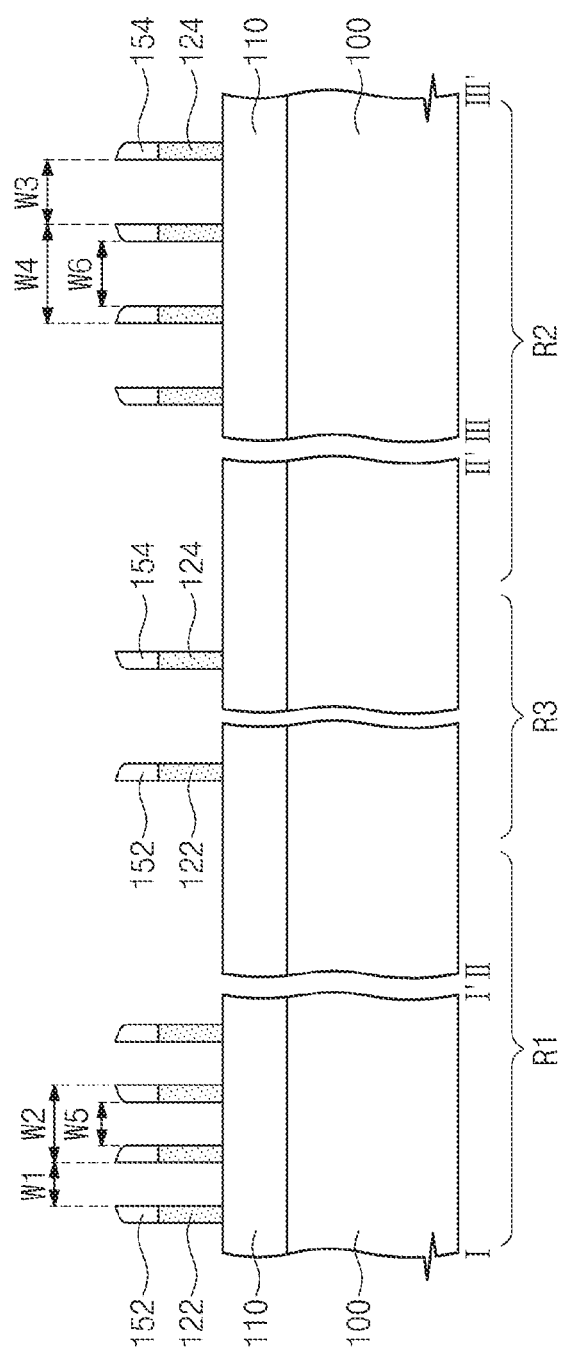

Referring to FIGS. 3A and 3B, the first and second sacrificial patterns 132 and 134 may be removed. In exemplary embodiments, the first and second sacrificial patterns 132 and 134 may be removed by, for example, an ashing and/or strip process.

Subsequently, the upper mask layer 120 may be etched by an etching process in which the first and second spacers 152 and 154 are used as an etch mask, and as a result, first and second upper mask patterns 122 and 124 may be formed on the lower mask layer 110. When viewed in plan, the first and second upper mask patterns 122 and 124 may be formed to have substantially the same shapes as those of the first and second spacers 152 and 154, respectively. Meanwhile, although FIG. 3A illustrates only one of the end portions of each of the first and second upper mask patterns 122 and 124, the opposite end portions may be formed to have substantially the same shapes as the illustrated ones. This means that each of the first upper mask patterns 122 may have a closed-loop shape include a pair of line patterns elongated in the second direction D2 and connected to each other. In exemplary embodiments, a distance between inner sidewall surfaces of each of the first upper mask patterns 122 may be substantially the same as the first width W1 of the corresponding one of the first sacrificial patterns 132. Furthermore, the distance between the first upper mask patterns 122, adjacent to each other in the second direction D2, may be substantially the same as the fifth width W5.

Similarly, each of the second upper mask patterns 124 may include a pair of line patterns elongated in the second direction D2 and connected to each other and thereby having a closed-loop shape. In an example of the representative embodiment, the distance between inner sidewall surfaces of each of the second upper mask patterns 124 may be substantially the same as the third width W3 of a corresponding one of the second sacrificial patterns 134. Furthermore, the distance between second upper mask patterns 124, adjacent to each other in the second direction D2, may be substantially the same as the sixth width W6. In certain embodiments, the etching process for forming the first and second upper mask patterns 122 and 124 may leave the first and second spacers 152 and 154 on the first and second upper mask patterns 122 and 124.

Figure 4A:
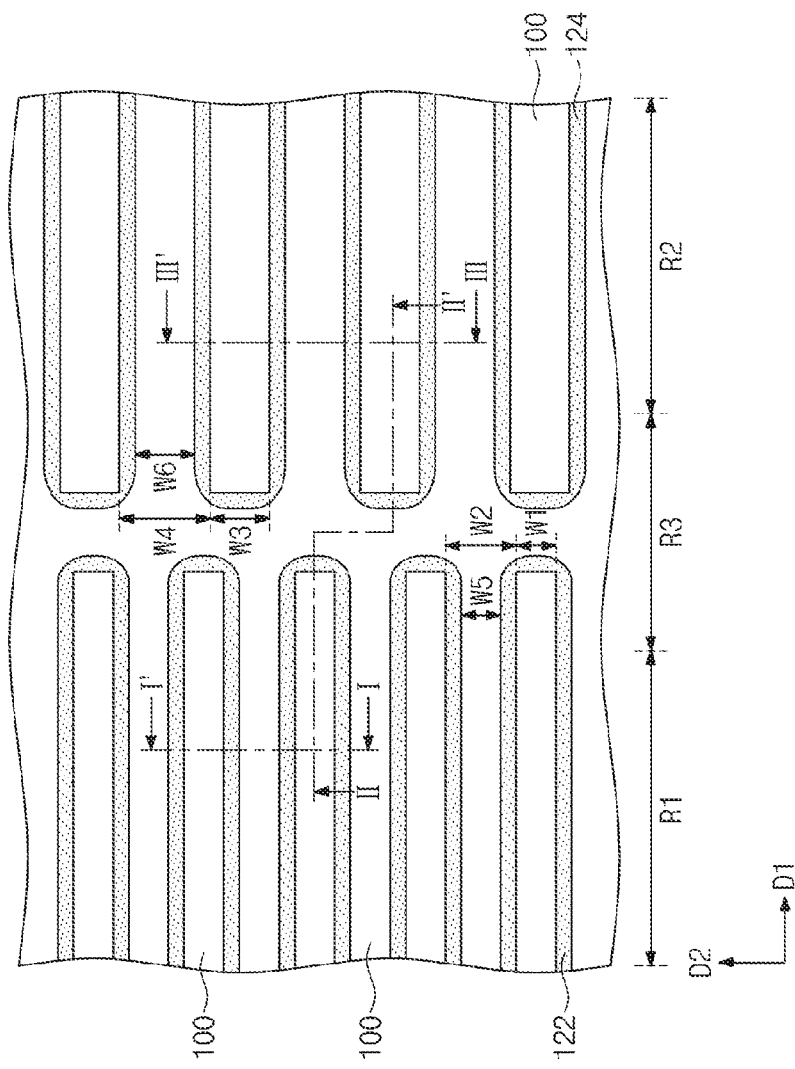
Figure 4B:
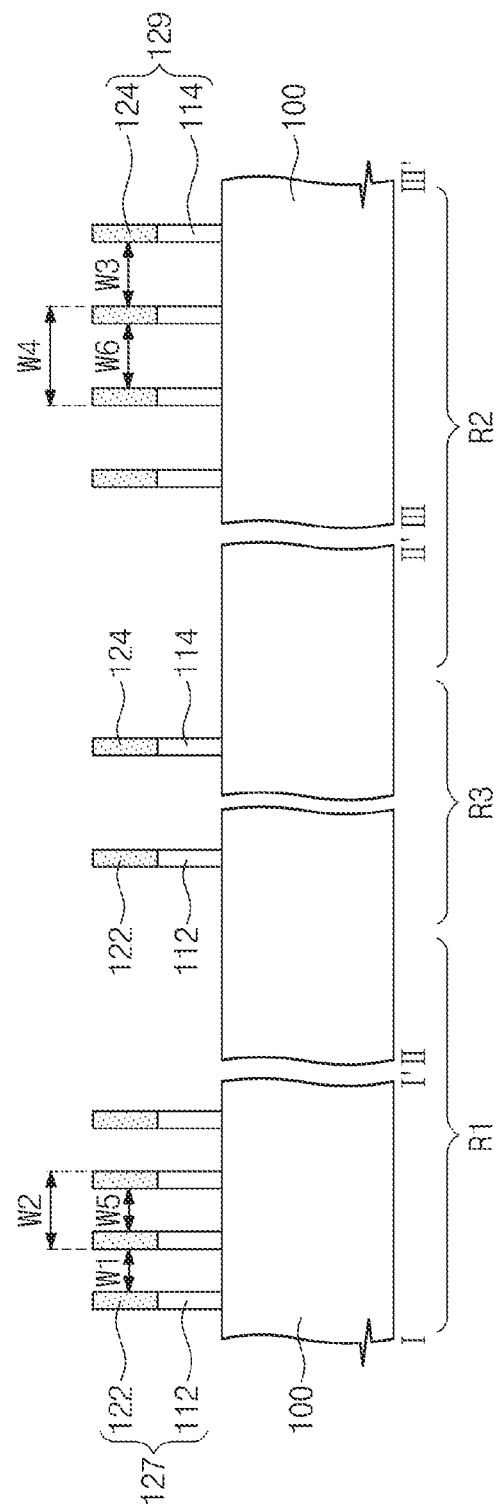

Referring to FIGS. 4A and 4B, the lower mask layer 110 may be etched by an etching process, in which the first and second upper mask patterns 122 and 124 are used as an etch mask, to form first and second lower mask patterns 112 and 114. When viewed in plan, the first and second lower mask patterns 112 and 114 may be formed to have substantially the same shapes as the first and second upper mask patterns 122 and 124, respectively. The first upper mask patterns 122 and the first lower mask patterns 112 may constitute first hard mask patterns 127, and the second upper mask patterns 124 and the second lower mask patterns 114 may constitute second hard mask patterns 129. In exemplary embodiments, the first and second spacers 152 and 154 may be removed during or before the etching process for forming the first and second lower mask patterns 112 and 114.

Figure 5A:
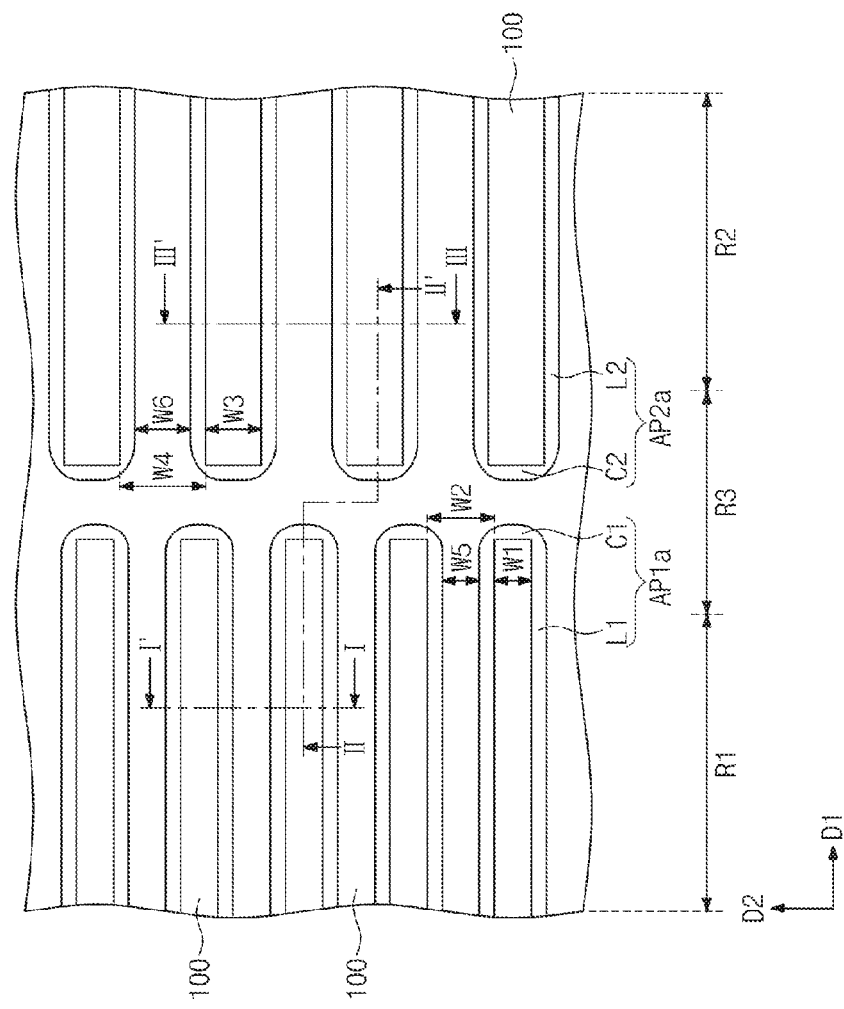
Figure 5B:
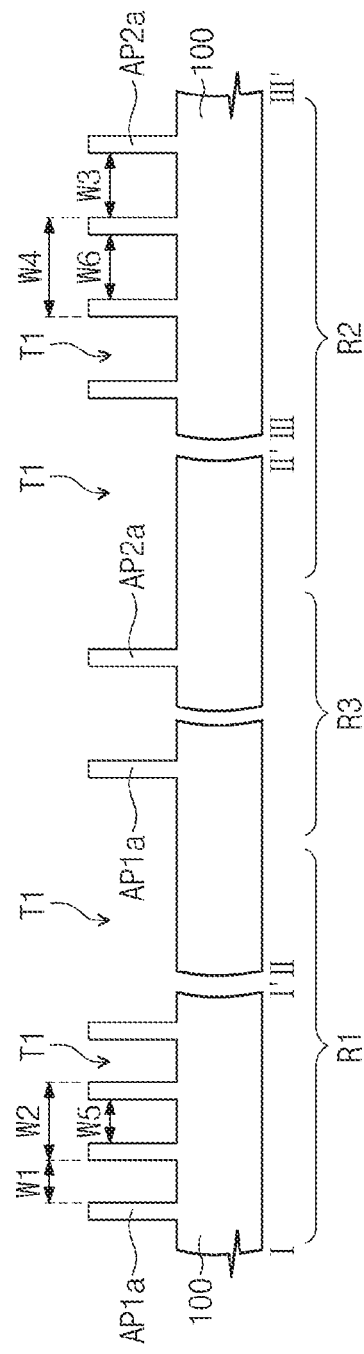

Referring to FIGS. 5A and 5B, an upper portion of the substrate 100 may be etched by an etching process, in which the first and second hard mask patterns 127 and 129 are used as an etch mask, to form first trenches T1 defining first and second preliminary active patterns AP1*a* and AP2*a*. The first preliminary active patterns AP1*a* may be formed in the first region R1, and the second preliminary active patterns AP2*a* may be formed in the second region R2. The first and second preliminary active patterns AP1*a* and AP2*a* protrude upwardly from a surface of the substrate 100. Any remaining portions of the first and second upper mask patterns 122 and 124 and/or the first and second lower mask patterns 112 and 114 may be removed after the first and second preliminary active patterns AP1*a* and AP2*a* have been formed.

When viewed in plan, the first preliminary active patterns AP1*a* may have substantially the same shape as the first upper mask patterns 122 and the first lower mask patterns 112. For example, each of the first preliminary active patterns AP1*a* may include a pair of first line patterns L1 extending parallel to the first direction D1 and first connection patterns C1 connecting ends of the first line patterns L1 to each other. Portions of the first line patterns L1 and the first connection patterns C1 may be located in the third region R3. The distance between the pair of the first line patterns L1 may be substantially equal to the first width W1 of the first sacrificial patterns 132. Furthermore, the distance between first preliminary active patterns AP1*a*, adjacent to each other in the second direction D2, may be substantially equal to the fifth width W5. In an example of the representative embodiment, the first width W1 is substantially equal to the fifth width W5.

Similarly, when viewed in plan, the second preliminary active patterns AP2*a* may have substantially the same shapes as the second upper mask patterns 124 and the second lower mask patterns 114. For example, each of the second preliminary active patterns AP2*a* may include a pair of second line patterns L2 extending parallel to the first direction D1 and second connection patterns C2 connecting the ends of the second line patterns L2 to each other. Portions of the second line patterns L2 and the second connection patterns C2 may be located in the third region R3. The distance between the pair of the second line patterns L2 may be substantially equal to the third width W3 of the second sacrificial patterns 132. Furthermore, the distance between second preliminary active patterns AP2a, adjacent to each other in the second direction D2, may be substantially equal to the sixth width W6. In an example of the representative embodiment, the third width W3 is substantially equal to the sixth width W6.

Figure 6B:
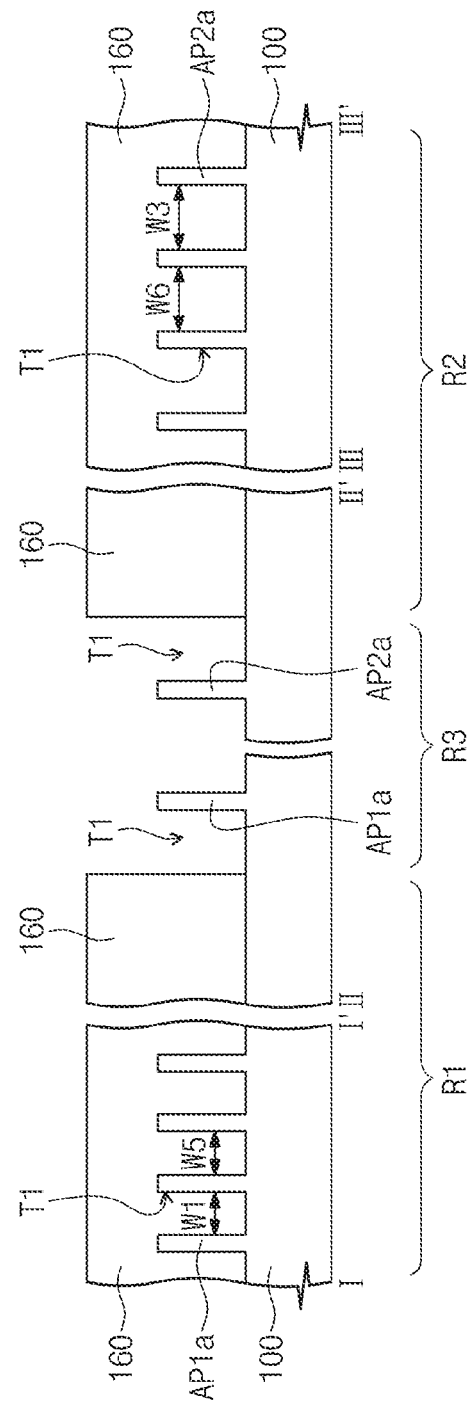

Referring to FIGS. 6A and 6B, first mask patterns 160 may be formed on the substrate 100. The first mask patterns 160 may be formed to expose the entire area of the third region R3. In other words, when viewed in plan, the first mask patterns 160 do not overlap with the third region R3. Thus, in this example, the first mask patterns 160 may be formed to expose portions of the first preliminary active patterns AP1a (e.g., the portions of the first line patterns L1 and the first connection patterns C1) and portions of the second preliminary active patterns AP2a (e.g., the portions of the second line patterns L2 and the second connection patterns C2). The first mask patterns 160 may be formed of or include, for example, an SOH material. The first mask patterns 160 may also expose the opposite end portions of the first and second preliminary active patterns AP1a and AP2a which are not shown in the figures.

Figure 7A:
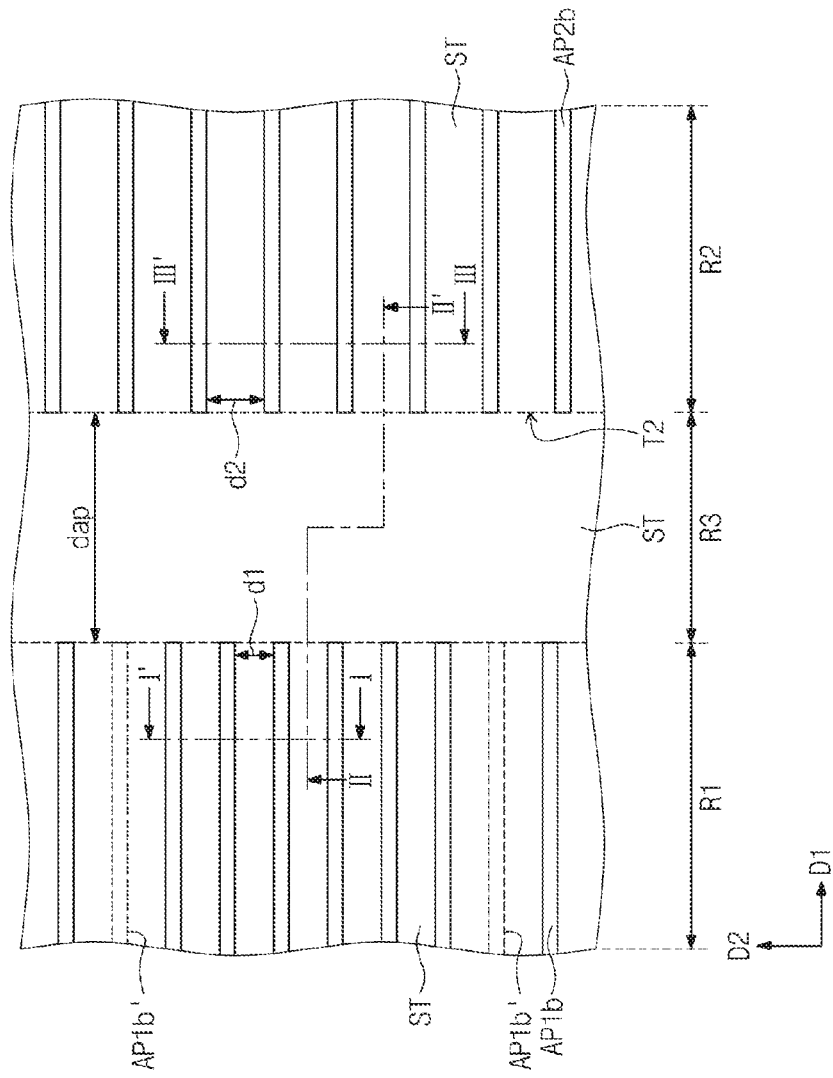
Figure 7B:
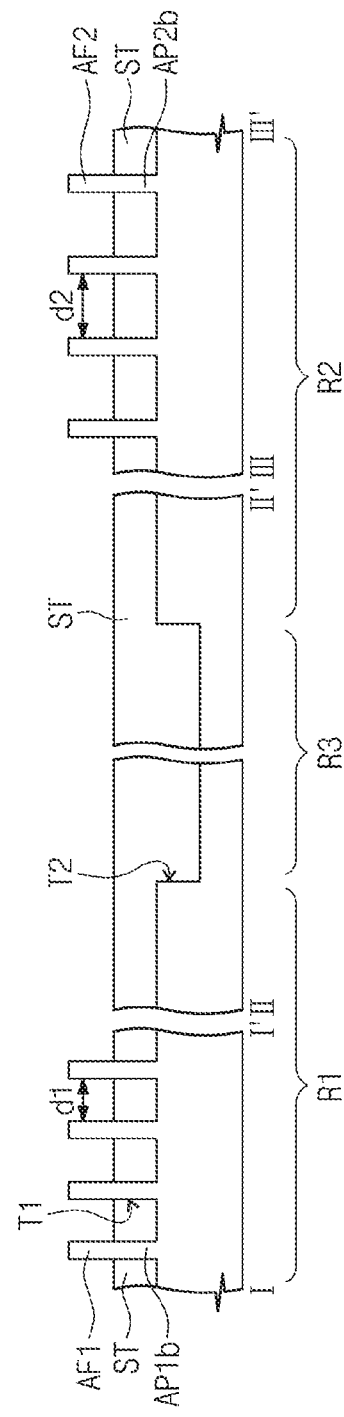

Referring to FIGS. 7A and 7B, an etching process, in which the first mask patterns 160 are used as an etch mask, may be performed to form a second trench T2. The second trench T2 may be formed to have a depth greater than that of the first trench T1. In other words, the second trench T2 may have a bottom surface lower than that of the first trench T1. In certain embodiments, the etching process may be performed to remove portions of the first preliminary active patterns AP1a (e.g., the portions of the first line patterns L1 and the first connection patterns C1) and portions of the second preliminary active patterns AP2a(e.g., the portions of the second line patterns L2 and the second connection patterns C2) in the third region R3. As a result, first and second active patterns AP1b and AP2b are formed from the first and second preliminary active patterns AP1a and AP2a, respectively. Hereinafter, the series of steps for removing the portions of the first and second preliminary active patterns AP1a and AP2a will be referred to as a "fin cut process".

The first active patterns AP1b may each have a linear structure extending longitudinally in the first direction D1 and may be spaced apart from each other in the second direction D2. Similarly, the second active patterns AP2b may each have a linear structure extending longitudinally in the first direction D1 and may be spaced apart from each other in the second direction D2. When measured in the second direction D2, the distances between the first active patterns AP1b may correspond to the first and fifth widths W1 and W5 of the first preliminary active patterns AP1a. In the case in which the first and fifth widths W1 and W5 are substantially equal to each other, the distances between the first active patterns AP1b in the second direction D2 may be uniform (e.g., a first distance d1). When measured in the second direction D2, the distances between the second active patterns AP2b may correspond to the third and sixth widths W3 and W6 of the second preliminary active patterns AP2a. In the case in which the third and sixth widths W3 and W6 are substantially equal to each other, the distances between the second active patterns AP2b in the second direction D2 may be uniform (e.g., a second distance d2). In the present embodiment, the first distance d1 is different from the second distance d2. For example, the second distance d2 may be larger than the first distance d1.

The first mask patterns 160 may be removed after the second trench T2 has been formed. The first mask patterns 160 may be removed by, for example, an ashing and/or strip process. In some examples of the representative embodiments, unnecessary portions of the first active patterns AP1b (hereinafter, first unnecessary portions AP1b') are removed. For example, the removing of the first unnecessary portions AP1b' may include forming a mask pattern (not shown) exposing the first unnecessary portions AP1b' and etching the first unnecessary portions AP1b' using the mask pattern as an etch mask.

Next, device isolation patterns ST may be formed in the first and second trenches T1 and T2. For example, the forming of the device isolation patterns ST may include forming a device isolation layer on the substrate 100 to fill the first and second trenches T1 and T2 and planarizing the device isolation layer to expose the substrate 100. The upper portions of the device isolation patterns ST may be etched to expose upper portions of the first and second active patterns AP1b and AP2b. Hereinafter, the exposed upper portions of the first and second active patterns AP1b and AP2b, i.e., the upper portions of the first and second active patterns AP1b and AP2b protruding upwardly relative to the device isolation patterns ST, will be referred to as "first and second active fins AF1 and AF2", respectively.

As a result of the above-described process, the first active patterns AP1b may have end surfaces that are aligned along the second direction D2 at a boundary of the first and third regions R1 and R3. Also, the top surface of the substrate 100 in the first region R1 may meet a sidewall surface of the substrate defining the side of the second trench T2 at the boundary of the first and third regions R1 and R3. Similarly, the second active patterns AP2b may have end surfaces that are aligned along the second direction D2 at a boundary of the second and third regions R2 and R3. Also, the top surface of the substrate 100 in the second region R2 may meet a sidewall surface of the substrate defining the side of the second trench T2 at the boundary between the second and third regions R2 and R3. In other words, the width of the third region R3 (dimension of the third region R3 in the first direction D1) may be the distance 'dap' between opposing end surfaces of the first and second active patterns AP1b and AP2b. Here, the distance dap may be substantially equal to the width of the second trench T2. In other words, the width of the second trench T2 may be equal to the width of the third region R3. Furthermore, although the second trench T2 is shown as having vertical sides in the drawings, the second trench T2 may have a downward tapered profile. Thus, the largest width of the second trench T2 may be considered as the width of the second trench T2. The third region R3 may be designed to be as narrow as possible while still being capable of substantially preventing electrical interference or disturbance between transistors (i.e., FETs) of the first and second regions R1 and R2.

More specifically, in the case in which first and second active patterns of a semiconductor device have pitches different from each other, due to limits in the resolution of a photolithography process for forming them, the first active patterns and the second active patterns would normally have to be spaced apart from each other, collectively, by a distance larger than that required to provide a reliable device. This leads to an extra expense in chip area overhead. In contrast, in representative embodiments according to the inventive concept, the first and second groups of active patterns AP1b and AP2b can be formed as close to one another as possible, without being limited by the resolution that can be attained in the photolithography process used in the method of forming the patterns. Although a pattern defect in the first and second photoresist patterns (e.g., the forming of connection patterns 146 as described with reference to FIGS. 9A and 9B) may lead to a similar or partial defect in the first and second preliminary active patterns AP1a and AP2a, such defects of the first and second preliminary active patterns AP1a and AP2a can be removed through the fin cut process of FIGS. 7A and 7B. As a result, it is possible to form transistors in the first and second regions R1 and R2 which will operate without electrical interference occurring therebetween while at the same time minimizing the area of the third region R3 that separates the transistors formed in the first region R1 from the transistors formed in the second region R2. In other words, it is possible to provide transistors at different pitches in a minimal amount of area in a chip.

Figure 8A:
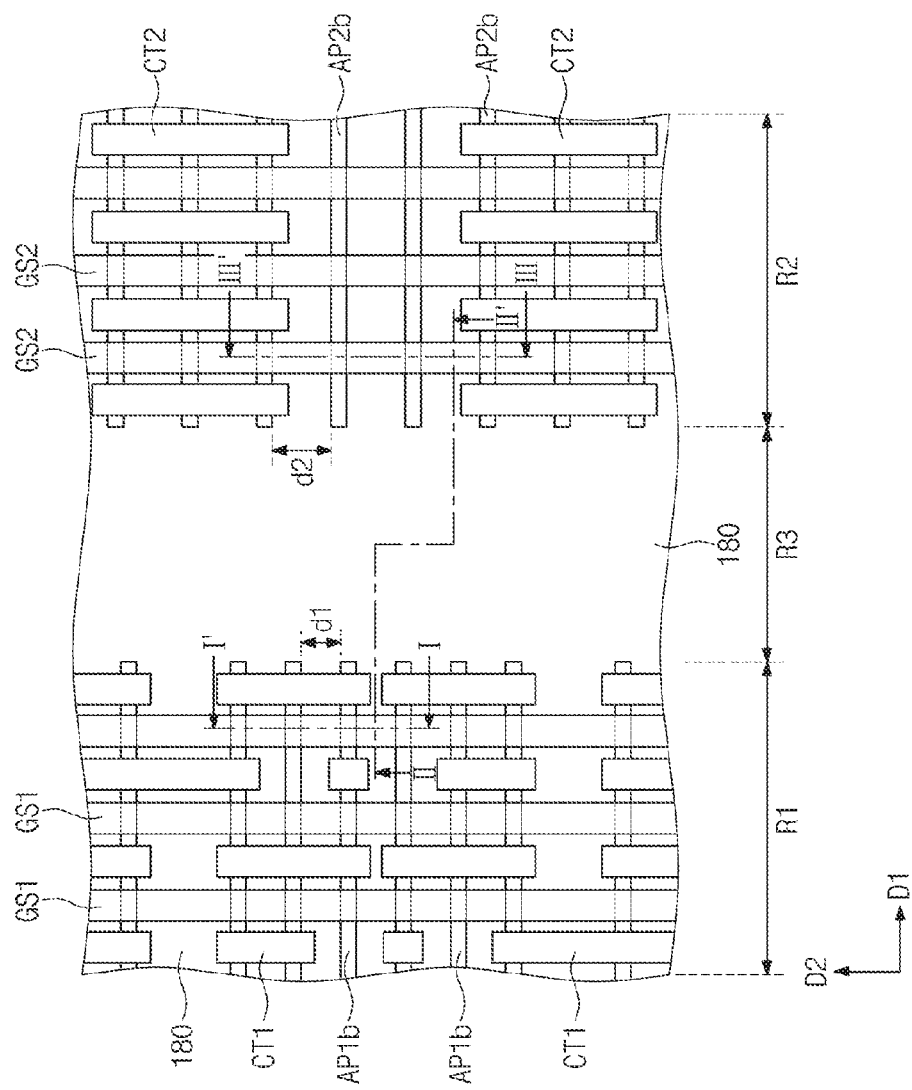
Figure 8B:
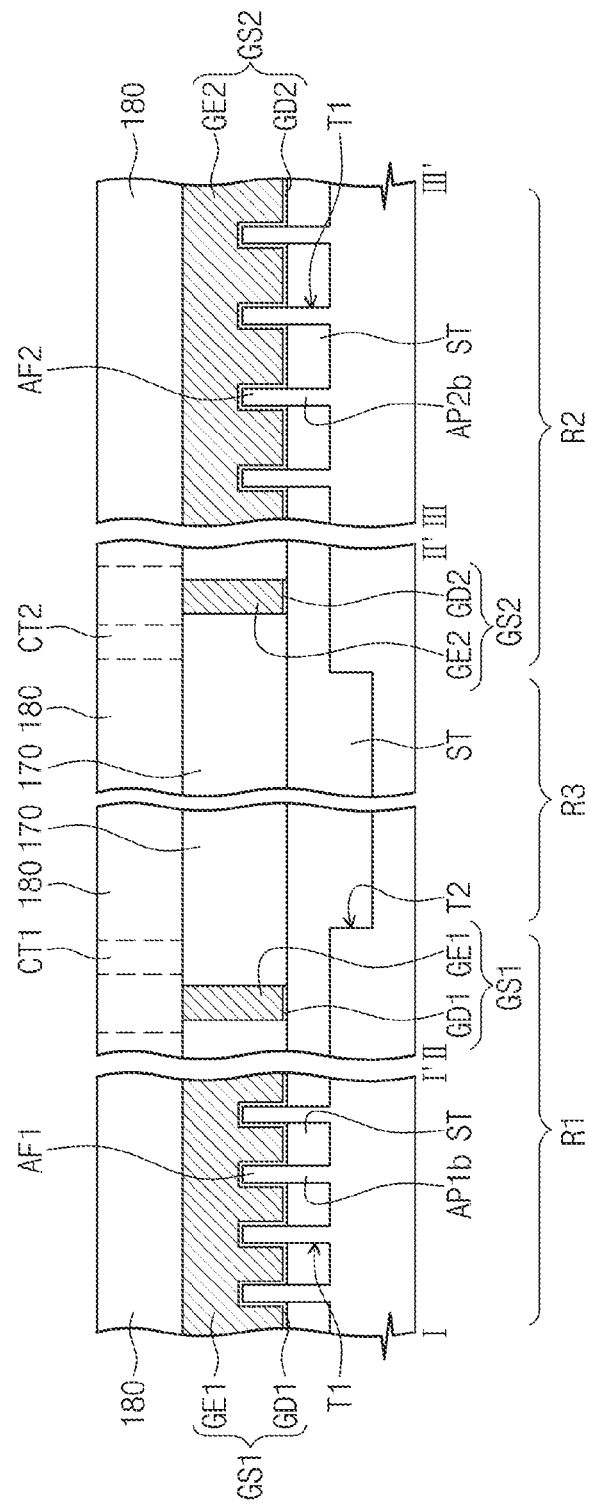

FIGS. 8A and 8B illustrate steps in completing the forming of transistors in the first and second regions R1 and R2.

Referring to these figures, first and second gate structures GS1 and GS2 may be formed on the substrate 100 to cross the first and second active patterns AP1b and AP2b, respectively. Each of the first gate structures GS1 may include a first gate dielectric pattern GD1 and a first gate electrode GE1 sequentially stacked on the substrate 100. Each of the second gate structures GS2 may include a second gate dielectric pattern GD2 and a second gate electrode GE2 sequentially stacked on the substrate 100. In an example of the representative embodiments, the forming of the first and second gate structures GS1 and GS2 includes forming a first interlayer insulating layer 170 with openings and sequentially forming a gate dielectric layer and a gate electrode layer in the openings. In another example of the representative embodiment, the forming of the first and second gate structures GS1 and GS2 includes forming a gate dielectric layer and gate electrode layer sequentially on the substrate 100, and then patterning the gate dielectric layer and the gate electrode layer. In this example, the first interlayer insulating layer 170 may be formed after the first and second gate structures GS1 and GS2 have been formed. The first and second gate dielectric patterns GD1 and GD2 may be formed of or include at least one of a silicon oxide layer, a silicon oxynitride layer, and a high-k dielectric material whose dielectric constant is higher than that of the silicon oxide layer. The first and second gate electrodes GE1 and GE2 may include at least one material selected from the group consisting of doped semiconductor materials, metals, and conductive metal nitrides. The first interlayer insulating layer 170 may include at least one of, for example, a silicon oxide layer, a silicon nitride layer, and a silicon oxynitride layer. Although not shown, gate spacers may be formed on both sides of each of the first and second gate structures GS1 and GS2. Note, also, during the forming of the first and second gate structures GS1 and GS2, dummy patterns (i.e., dummy gate structures) do not have to be formed in the third region R3.

First source/drain regions may be formed in the first active patterns AP1b and at both sides of each first gate structure GS1, and second source/drain regions may be formed in the second active patterns AP2b and at both sides of each second gate structure GS2. The first gate structures GS1 and the first source/drain regions may constitute memory cell transistors of the cell array described with reference to FIGS. 1A and 1B. The regions of the first active fins AF1 disposed below the first gate structures GS1 may serve as channel regions of the memory cell transistors. Similarly, the second gate structures GS2 and the second source/drain regions may constitute peripheral circuit transistors of the peripheral circuit described with reference to FIGS. 1A and 1B. The regions of the second active fins AF2 disposed below the second gate structures GS2 may serve as channel regions of the peripheral circuit transistors.

Subsequently, first contacts CT1 and second contacts CT2 may be formed to apply voltages to the first and second source/drain regions, respectively. The first and second contacts CT1 and CT2 may be formed to penetrate a second interlayer insulating layer 180, which may be provided to cover top surfaces of the first and second gate structures GS1 and GS2. The second interlayer insulating layer 180 may include at least one of, for example, a silicon oxide layer, a silicon nitride layer, and a silicon oxynitride layer.

In the device of FIGS. 8A and 8B formed by a representative embodiment, as mentioned above, the first region R1 may be a cell array region in which a plurality of memory cell transistors for storing data are disposed. For example, SRAM cells, each of which includes six or eight transistors, are disposed in the first region R1. The second region R2 may be a portion of a peripheral circuit region at which peripheral circuit is disposed. For example, a column decoder or a sense amplifier is disposed in the second region R2. Peripheral circuit transistors electrically connected to the memory cell transistors of the first region R1 are disposed in the second region R2. The third region R3 serves as a buffer region separating the transistors of the first and second regions R1 and R2 from each other, and the third region R3 prevents the transistors of the first and second regions R1 and R2 from disturbing or interfering with each other when the transistors of the first and second regions R1 and R2 are operating. And yet, the third region R3 may be relatively narrow. Moreover, dummy patterns are not interposed between the substrate 100 and the first interlayer insulating layer 170 in the third region R3.

FIG. 10 illustrates an example of electronic systems including a semiconductor device fabricated according to the inventive concept.

Referring to FIG. 10, an electronic system 1100 may include a controller 1110, an input-output (I/O) unit 1120, a memory device 1130, an interface 1140, and a bus 1150 serving as a pathway for data communication. The controller 1110, the input-output unit 1120, the memory device 1130 and/or the interface 1140 may be connected or coupled to each other via the bus 1150.

The controller 1110 may include, for example, a microprocessor, a digital signal processor, a microcontroller, or any other logic device for that matter having a similar function to a microprocessor, digital signal processor, or microcontroller. The input-output unit 1120 may include at least one of a keypad, keyboard, and a display device. The memory device 1130 may be configured to store data and/or commands. The interface unit 1140 may transmit electrical data to a communications network or may receive electrical data from a communications network. The interface unit 1140 may operate in a wired or wireless manner. For example, the interface unit 1140 may include an antenna for wireless communication or a transceiver for wired communication. Although not shown in the drawings, the electronic system 1100 may further include a fast DRAM device and/or a fast SRAM device which acts as a cache memory for improving an operation of the controller 1110. A semiconductor device fabricated according to the inventive concept may be provided in the memory device 1130 or as a part of the controller 1110 and/or the I/O unit 1120.

The electronic system 1100 may be employed by electronic products such as a personal digital assistant (PDA), a portable computer, a web tablet, a wireless phone, a mobile phone, a digital music player, or a memory card, or any other type of product that may transmit/receive data in a wireless manner. Other examples of products to which the electronic system 1100 of FIG. 10 may be applied include MP3 players, navigators (GPS), solid state drives (SSDs), automobiles, and household appliances.

FIG. 11 illustrates one such example of electronic product which may employ the electronic system 1100 of FIG. 10. That is, as shown in FIG. 11, the electronic system 1100 of FIG. 10 can be that of a mobile phone 1200.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments and examples described above but by the following claims.

What is claimed is:

1. A semiconductor device, comprising:
a substrate with a first region, a second region, and a third region between the first and second regions;
first active patterns protruding upward from the first region of the substrate, extending in a first direction crossing the first to third regions, and being spaced apart from each other in a second direction crossing the first direction;
second active patterns protruding upward from the second region of the substrate, extending in the first direction, and being spaced apart from each other in the second direction, first distances between adjacent ones of the first active patterns are different from second distances between adjacent ones of the second active patterns when measured in the second direction;
a first gate structure crossing the first active patterns; and
a second gate structure crossing the second active patterns,
wherein the third region is defined by a trench, which is provided on the substrate and between the first and second regions,
sidewall surfaces of the first active patterns are aligned along the second direction at a boundary between the first and third regions, and
sidewall surfaces of the second active patterns are aligned along the second direction at a boundary between the second and third regions.

2. The device of claim 1, wherein when measured in the first direction, a largest width of the trench is substantially equal to a distance between the sidewall surfaces of the first and second active patterns.

3. The device of claim 1, wherein when viewed in a sectional view, a top surface of the first region of the substrate meets a sidewall of the trench at the boundary of the first and third region and a top surface of the second region of the substrate meets an opposite sidewall of the trench at the boundary of the second and third regions.

4. The device of claim 1, wherein the first gate structure serves as a part of a memory cell transistor, and
the second gate structure serves as a part of a peripheral circuit transistor.

5. The device of claim 4, wherein the second distances are larger than the first distances.

6. A semiconductor device, comprising:
a substrate with a cell array region, a peripheral circuit region, and a buffer region, the cell array region and the peripheral circuit region being spaced apart from each other in a first direction with the buffer region interposed there between;
first active patterns protruding upward from the cell array region of the substrate, extending in the first direction, and being spaced apart from each other in a second direction crossing the first direction;
second active patterns protruding upward from the peripheral circuit region of the substrate, extending in the first direction, and being spaced apart from each other in the second direction, distances between adjacent ones of the first active patterns are smaller than those between adjacent ones of the second active patterns when measured in the second direction;
a first gate structure crossing the first active patterns and serving as a part of a memory cell transistor; and
a second gate structure crossing the second active patterns and serving as a part of a peripheral circuit transistor,
wherein the buffer region is defined by a single trench, which is provided on the substrate and between the cell array region and the peripheral circuit region.

7. The device of claim 6, wherein sidewall surfaces of the first active patterns are aligned along the second direction at a boundary between the cell array region and the buffer region, and
sidewall surfaces of the second active patterns are aligned along the second direction at a boundary between the peripheral circuit region and the buffer region.

8. The device of claim 7, wherein when measured in the first direction, a largest width of the single trench is substantially equal to a distance between the sidewall surfaces of the first and second active patterns.

9. The device of claim 7, wherein when viewed in a sectional view, a top surface of the cell array region of the substrate meets a sidewall of the single trench at the boundary of the cell array region and the buffer region and a top surface of the peripheral circuit region of the substrate meets an opposite sidewall of the single trench at the boundary of the peripheral circuit region and the buffer region.

10. A semiconductor device comprising:
a substrate including a first region and a second region, the first and second regions being spaced apart from each other in a first direction with a single trench provided on the substrate and between the first and second regions;
a first transistor provided on the first region, wherein the first transistor comprises: first active patterns protruding upward from the first region of the substrate, extending in the first direction, and being spaced apart from each other in a second direction crossing the first direction; a first gate structure crossing the first active patterns; and first source/drain regions disposed at both sides of the first gate structure; and
a second transistor provided on the second region, wherein the second transistor comprises: second active patterns protruding upward from the second region of the substrate, extending in the first direction, and being spaced apart from each other in the second direction; a second gate structure crossing the second active patterns; and second source/drain regions disposed at both sides of the second gate structure,
wherein first distances between adjacent ones of the first active patterns are different from second distances between adjacent ones of the second active patterns when measured in the second direction.

11. The device of claim 10, wherein the second distances are larger than the first distances.

12. The device of claim 10, wherein, when viewed in a plan view, first ends of the first active patterns adjacent to the single trench are aligned along the second direction, and
second ends of the second active patterns adjacent to the single trench are aligned along the second direction.

13. The device of claim 12, wherein when measured in the first direction, a largest width of the trench is substantially equal to a distance between the first ends of the first active patterns and the second ends of the second active patterns.

14. The device of claim 10, wherein the first gate structure serves as a part of a memory cell transistor, and
the second gate structure serves as a part of a peripheral circuit transistor.

* * * * *